(12) United States Patent
Lennous

(10) Patent No.: US 6,608,516 B1
(45) Date of Patent: Aug. 19, 2003

(54) ADJUSTABLE TIME CONSTANT INTEGRATOR

(75) Inventor: Paul A. Lennous, Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 10/061,007

(22) Filed: Jan. 30, 2002

(51) Int. Cl.[7] .................................................. G06G 7/19
(52) U.S. Cl. ........................ 327/344; 327/345; 327/336
(58) Field of Search ................................ 327/336, 337, 327/339, 341, 344, 345

(56) References Cited

U.S. PATENT DOCUMENTS

| 4,896,672 A | * | 1/1990 | O'Toole ...................... 600/445 |
| 5,235,223 A | * | 8/1993 | Maple ......................... 327/556 |
| 5,557,267 A | * | 9/1996 | Poduje et al. .......... 340/870.04 |
| 5,708,376 A | * | 1/1998 | Ikeda ........................... 327/50 |
| 6,060,935 A | * | 5/2000 | Shulman ..................... 327/345 |
| 6,160,448 A | * | 12/2000 | Werrbach ............... 330/124 R |
| 6,304,128 B1 | * | 10/2001 | Shulman ..................... 327/345 |
| 6,367,020 B1 | * | 4/2002 | Klein ......................... 713/202 |
| 2001/0033196 A1 | | 10/2001 | Lennous et al. |

* cited by examiner

*Primary Examiner*—Terry D. Cunningham
(74) *Attorney, Agent, or Firm*—Meyertons Hood Kivlin Kowert & Goetzel, P.C.; Jeffrey C. Hood

(57) ABSTRACT

A variable time constant integrator includes an amplifier configured to generate an output signal, a capacitor coupled to provide feedback to the amplifier, and a variable gain element coupled to the output of the amplifier and to the capacitor. The variable gain element is configured to provide the product of a gain and the output signal to the capacitor. The variable gain element is also configured to receive an indication of a new value of the gain and to responsively set the gain equal to the new value of the gain. Adjusting the gain of the variable gain element adjusts the integrator's time constant.

9 Claims, 9 Drawing Sheets

ADJUSTABLE TIME CONSTANT INTEGRATOR

FIELD OF THE INVENTION

The present invention relates to electronic circuits and, more particularly, to adjusting the time constant of an integrator.

DESCRIPTION OF THE RELATED ART

Instrumentation or data acquisition (DAQ) systems are often used to obtain measurement data pertaining to physical phenomena (e.g., force, pressure, acceleration, etc.). Such measurement data is useful in laboratory research and testing, process monitoring and control, and control of mechanical or electrical machinery, to name a few examples. A typical analog instrumentation system includes signal conditioning circuitry which performs one or more "signal conditioning" functions upon analog measurement signals. Such signal conditioning functions include amplification, filtering, and direct current (DC) level shifting.

Signal conditioning circuitry often includes filters used to provide anti-aliasing and noise reduction. Filters provide noise reduction by filtering out extraneous signals above and/or below the frequency range of interest. Anti-aliasing filters are often used to attenuate signals input to or output from a sampling system that have frequencies that exceed half the sampling (or Nyquist) frequency in order to prevent distortion that may arise due to aliasing.

In general, signal filters pass signal frequencies within a pass band and attenuate signal frequencies within a stop band outside of the pass band. A "cutoff frequency" or "corner frequency" $f_c$ defines a boundary between the pass band and the stop band. Common types of signal filters include low pass, high pass, and band pass filters. The pass band of a low pass filter extends from DC (0 Hz) to fc, and the stop band of a low pass filter lies above fc. A high pass filter has a pass band above fc, and a stop band including frequencies below fc. Graphs of ratios of output voltage to input voltage versus frequency for real (i.e., non-ideal) low and high pass filters have finite slopes within the stop bands. Low pass and high pass filters have quality factors or "Qs" which determine the slopes of such graphs within the stop bands.

Band pass filters have a pass band extending between a low corner frequency fl and a high corner frequency fh. Low corner frequency fl defines a boundary between the pass band and a first stop band including frequencies below fl, and high corner frequency fh defines a boundary between the pass band and a second stop band including frequencies above fh. A band pass filter has a center frequency fo representing a geometric mean off fh and fl, a bandwidth bw, and a selectivity or Q, where:

$fo = \sqrt{fh \cdot fl}$, $bw = fh - fl$, and $$Q = \frac{fo}{bw}$$

Active filters typically use components such as operational amplifiers (op amps), resistors, and capacitors to implement a desired signal filter. Active filters are able to provide signal gains of greater than unity. A state variable filter is a versatile type of active filter circuit that provides low pass, high pass, and band pass outputs simultaneously.

As filtering requirements change from application to application, it is highly desirable to be able to vary the characteristics of active filters (e.g., state variable filters) without having to replace resistors and/or capacitors with like components having different values. In many data acquisition systems, filters have electronically programmable bandwidths and/or corner frequencies, making it unnecessary to physically adjust the filter when reconfiguring the data acquisition system.

FIG. 1 is a circuit diagram of an exemplary prior art state variable filter 10 with programmable characteristics. State variable filter 10 includes two programmable multiplying digital to analog converters (MDACs) 12A and 12B that are used to attenuate the input to integrators 16A and 16B respectively. Digital values provided to and stored within the MDACs (collectively referred to as MDACs 12) determine the bandwidth of state variable filter 10.

Resistors R1 and R4 are coupled to op amp OA1 to form an inverting summing amplifier with a gain of –R4/R1. The summing amplifier sums the input signal, the amplified band pass signal, and the low pass signal to produce a high pass signal.

The high pass signal output from OA1 is input to MDAC 12A. MDAC 12A attenuates the signal being provided to resistor R6. Resistor R6 and capacitor C1 are coupled to op amp OA3 to form inverting integrator 16A. Inverting integrator 16A has a time constant equal to the product of resistance value R6 and feedback capacitance value C1. Together, MDAC 12A and inverting integrator 16A have a time constant equal to the gain of the MDAC 12A divided by resistance value R6 and feedback capacitance value C1. Inverting integrator 16A produces the band pass signal and provides an output signal to OA2 through R7 and to the input terminal of MDAC 12B.

OA2 is coupled to resistor R5 and resistor R7 to form an inverting amplifier. OA2 amplifies or attenuates the band pass signal output from OA3. The adjusted band pass output is provided to the input of OA1 through resistor R3.

MDAC 12B outputs a signal to inverting integrator 16B. Inverting integrator 16B includes resistor R8, capacitor C2 and op amp OA4. MDAC 12B and inverting integrator 16B form another programmable time constant integrator. Inverting integrator 16B produces the low pass output at an output terminal. The low pass output is provided through resistor R2 to the input of OA1.

The bandwidth for a state-variable filter is typically set by scaling the time constants of the integrating stages within the filter. The time constant for an integrator is commonly made adjustable by coupling an MDAC to an input of the integrator so that the time constant of the MDAC-integrator combination can be adjusted, as shown in FIG. 1. The addition of the MDAC to the integrator adds a time constant multiplier G the integrator's time constant. This multiplier G is the gain of the MDAC. Typically, G is less than one.

Two potential problems may arise in the programmable filter design shown in. FIG. 1. One potential problem is DC offset. For example, if the gain of the MDACs 12 in FIG. 1 is relatively high, the DC path through the filter will be strong and feedback in the circuit will help to nullify the effects of DC offset. However, if the gain of the MDACs 12 is set very low, the DC path through the filter may be constricted, and the DC offset of the filter may dramatically increase. In addition, the variable gain amplifier may contribute its own DC offset. To make matters worse, the DC offset of the filter may be directly dependent on the filter's bandwidth. Thus, there may be a different DC offset associated with each filter bandwidth setting.

The second potential problem is noise. The time constant of the variable gain integrator is modified by controlling the signal gain going into the integrator. While this changes the time constant of the overall circuit, the integrator itself still has the same time constant independent of any gain setting. The net result is that the inherent noise of the circuit may increase as the filter's bandwidth setting decreases. Unless low noise components are used in the circuit, this may create undesirable noise effects.

SUMMARY OF THE INVENTION

Various embodiments of a system and method for adjusting the time constant of an integrator are disclosed. In one embodiment, a variable time constant integrator includes an amplifier configured to generate an output signal, a capacitor coupled to provide feedback to the amplifier, and a variable gain element coupled to the output of the amplifier and to the capacitor. The variable gain element is configured to provide the product of a gain and the output signal to the capacitor. The variable gain element is also configured to receive an indication of a new value of the gain and to responsively set the gain equal to the new value of the gain. For example, the indication may be a voltage, and a level of the voltage may indicate the new value of the gain. Similarly, the indication may be a digital value representing the new value of the gain. In one embodiment, the variable gain element may include a MDAC.

An instrumentation system may include a transducer configured to convert one or more physical phenomena to an input signal and a signal conditioning subsystem coupled to receive the input signal from the transducer. The signal conditioning subsystem may include a filter configured to process the input signal. In order to allow the bandwidth of the filter to be adjusted, the filter may include one or more variable time constant integrators like the one described above. The filter may be a state variable filter in some embodiments. The instrumentation system may include a computer coupled to the signal conditioning subsystem. The computer system may be configured to receive and store measurement data generated by the signal conditioning subsystem.

BRIEF DESCRIPTION OF THE DRAWINGS

A better understanding of the present invention can be obtained when the following detailed description is considered in conjunction with the following drawings, in which.

Figure 1:
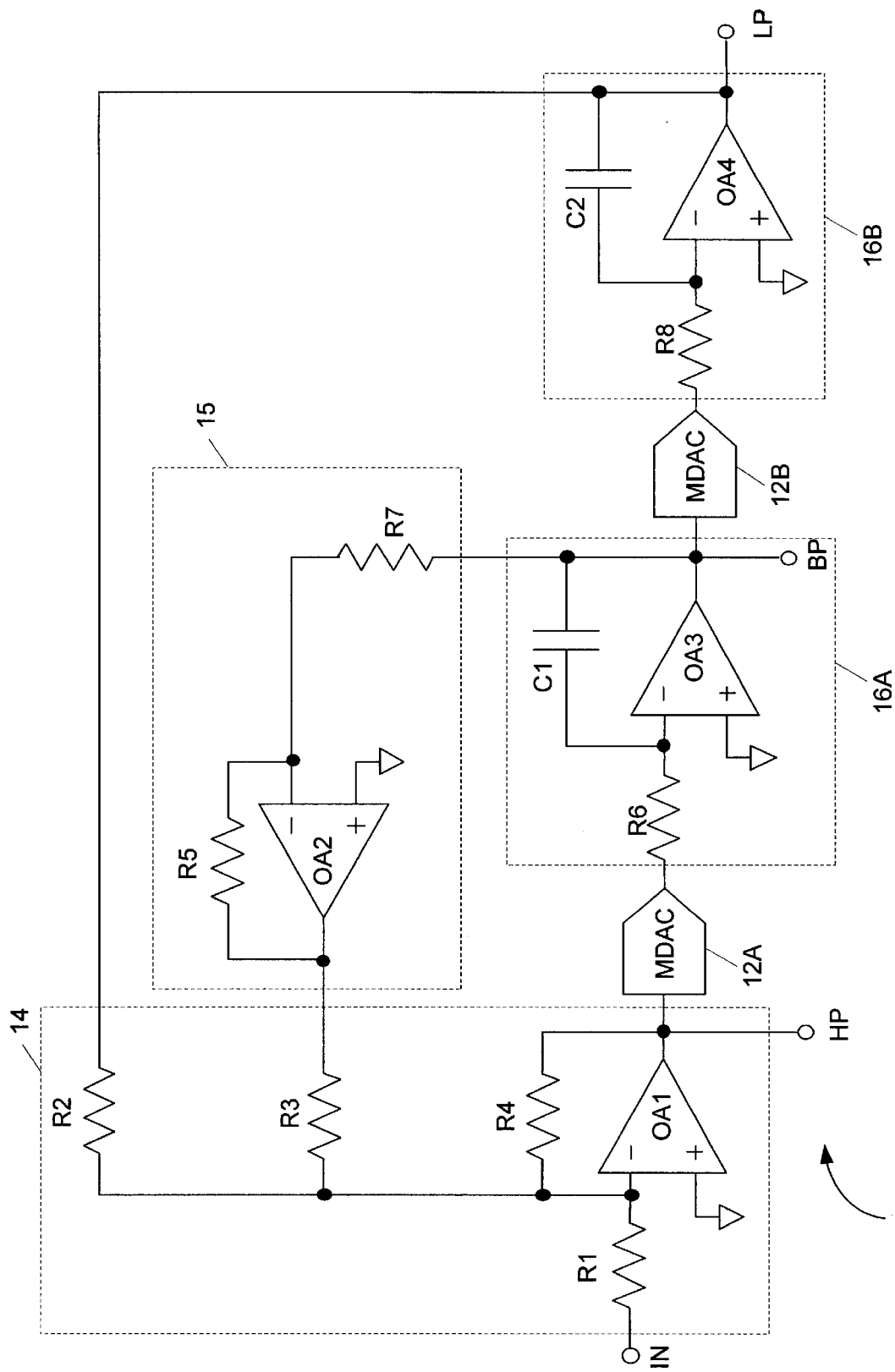
FIG. 1 is a schematic diagram of a typical state variable filter with a programmable bandwidth.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION OF THE EMBODIMENTS

Variable Time Constant Integrator

Figure 2:
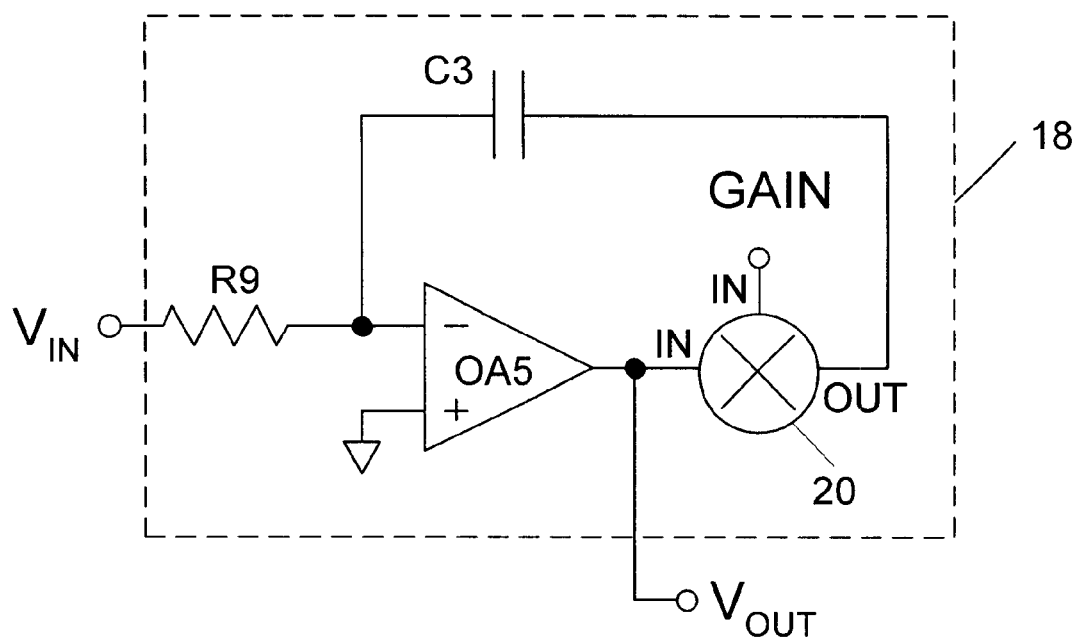
FIG. 2 shows one embodiment of an integrator circuit that includes a variable gain attenuator in the AC signal path.

FIG. 2 shows one embodiment of a variable time constant inverting integrator 18 with an adjustable AC signal path. In this embodiment, a variable gain element 20 is coupled in the AC signal path. The gain G of variable gain element 20 may be controlled by a digital interface, a voltage, mechanical means such as a knob or switch(es), etc.

In FIG. 2, resistor R9 is between the input terminal and the inverting input of op amp OA5. Capacitor C3 is coupled to provide feedback to the inverting input of OA5. Variable gain element 20 is coupled between the output of OA5 and C3.

A voltage $V_{IN}(t)$ applied to the input terminal of the inverting integrator produces an output voltage $V_{OUT}(t)$ where:

$$V_{OUT}(t) = -\left(\frac{1}{G \cdot R9 \cdot C3}\right) \cdot \int_{-\infty}^{t} V_{IN}(t) \, dt$$

Accordingly, the time constant of integrator 18A is G*R9*C3.

Since the variable gain element 20 is not in the DC signal path (unlike MDACs 12 of FIG. 1, which are in the DC signal path of each integrator), the DC offset of the inverting integrator may be reduced in some embodiments. Additionally, the inverting integrator's DC offset may be independent of the integrator's time constant in the embodiment shown in FIG. 2. Thus, the DC offset may be the same for most settings of the variable gain element (and consequentially, for most values of the integrator's time constant) in some embodiments. In addition, providing the variable gain element 20 in the AC signal path may reduce the DC offset contribution from the variable gain element, since its output is AC coupled.

In addition to possibly providing improved DC performance, the variable time constant integrator 18 shown in FIG. 2 may have improved noise performance. Since adjusting the gain of variable gain element 20 changes the time constant of the inverting integrator (unlike the integrator-MDAC combination shown in FIG. 1, which only changed the time constant of the overall circuit 10), variable time constant integrator 18 may provide improved noise performance.

Figure 3:
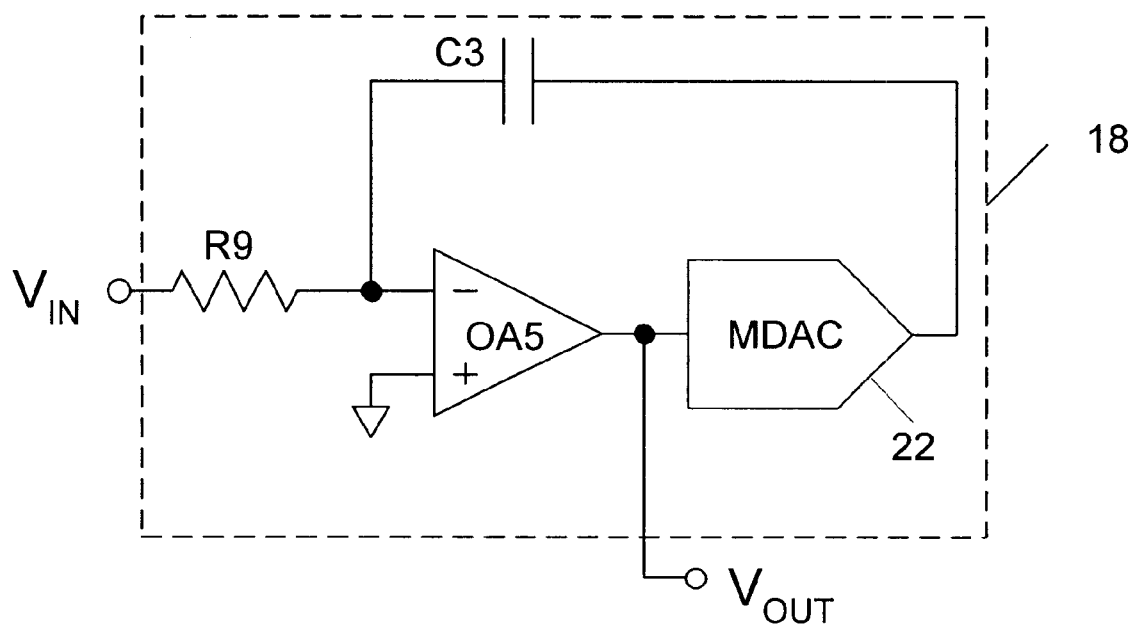
FIG. 3 shows an embodiment of an integrator circuit that includes a MDAC in the AC signal path.

A variable time constant integrator may be implemented using an MDAC, as shown in FIG. 3. In FIG. 3, an MDAC 22 is used as the variable gain element in the AC signal path. By using an MDAC, the inverting integrator has a digitally programmable time constant.

Figure 4:
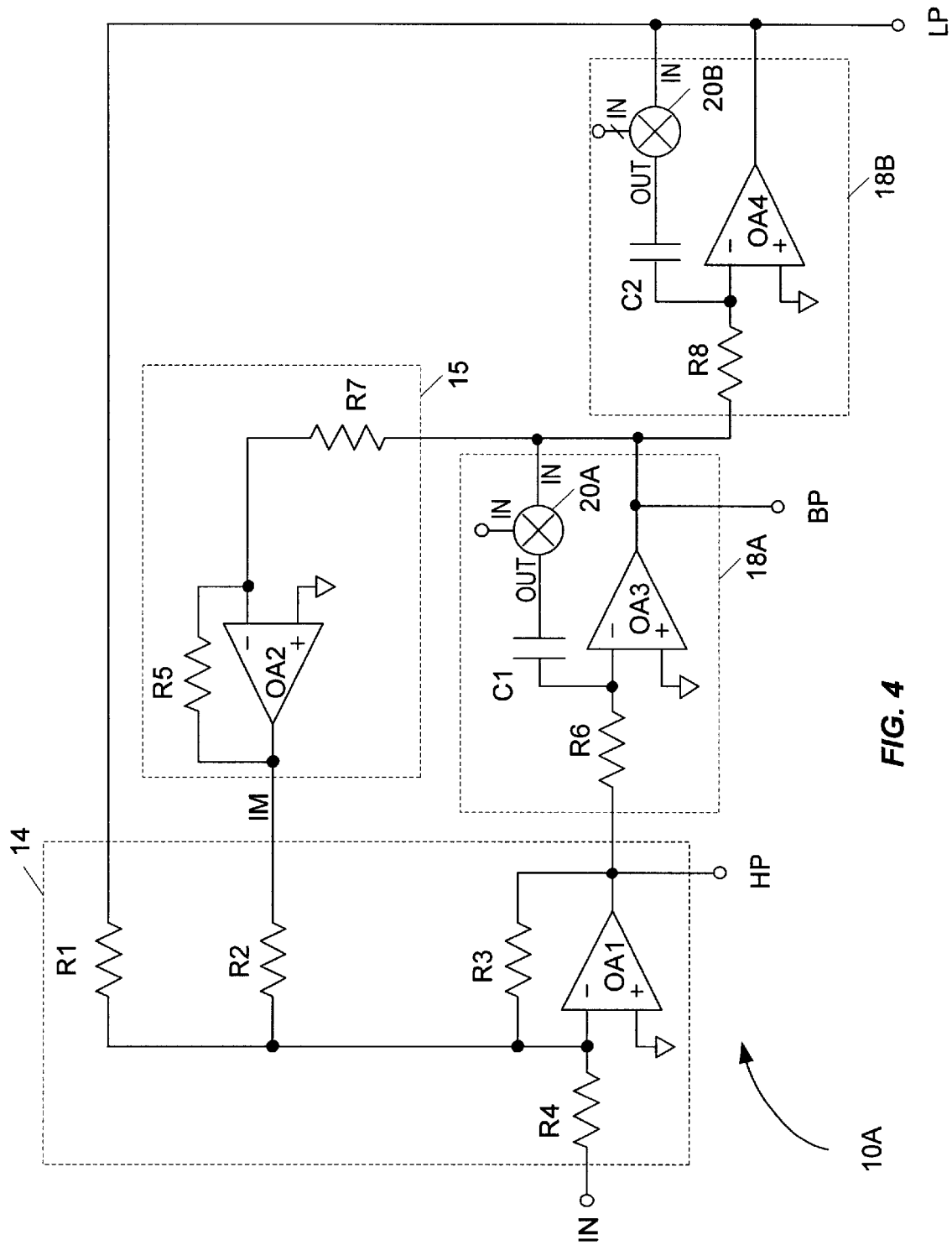
FIG. 4 shows one embodiment of a state variable filter circuit.
Figure 5:
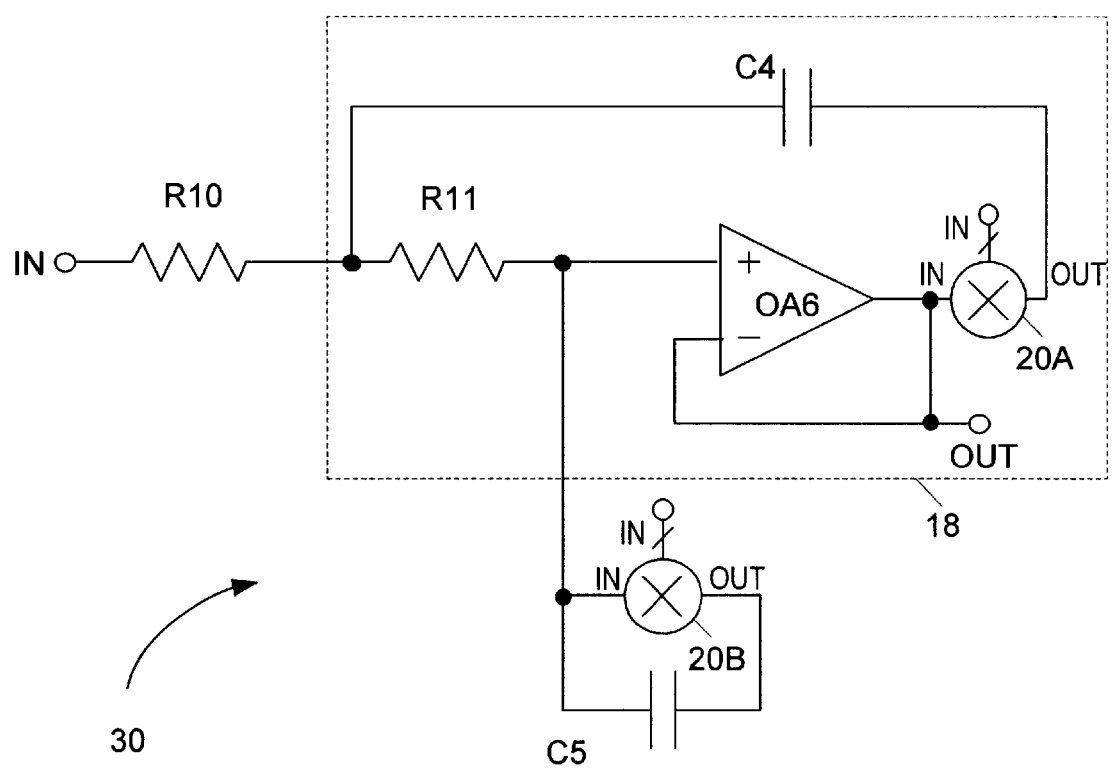
FIG. 5 shows one embodiment of a Sallen and Key filter.
Figure 6:
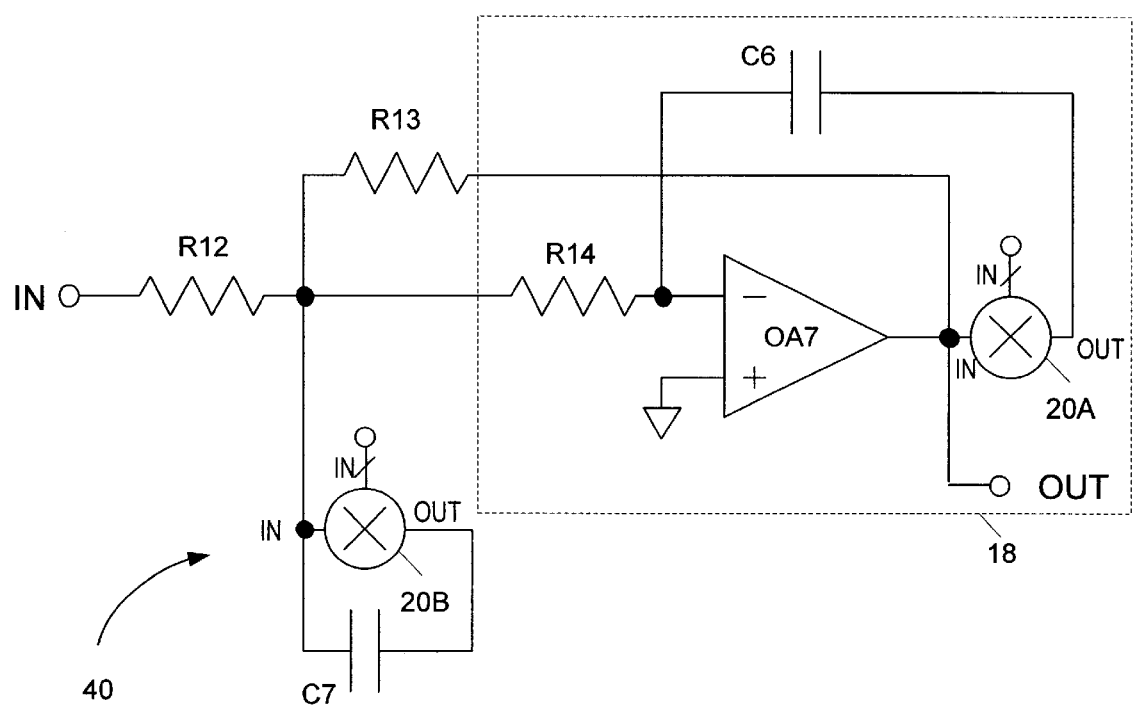
FIG. 6 shows one embodiment of a Friends or multiple feedback filter.

A variable time constant integrator like integrator 18 may be used in filters such as a state-variable filter (as shown in FIG. 4), a Sallen and Key filter (as shown in FIG. 5), a VCVS (Voltage Controlled Voltage Source) filter, and a multiple feedback or Friends filter (FIG. 6). Note that these filters are merely exemplary and embodiments of a variable time constant integrator may also be included in other circuits. For example, a variable time constant integrator like integrator 18A or 18B may also be used in a Proportional, Integral (PI) Controller or a Proportional, Integral, Derivative (PID) controller (as shown FIG. 7) as well as in a lag or a lead-lag controller.

Figure 3A:
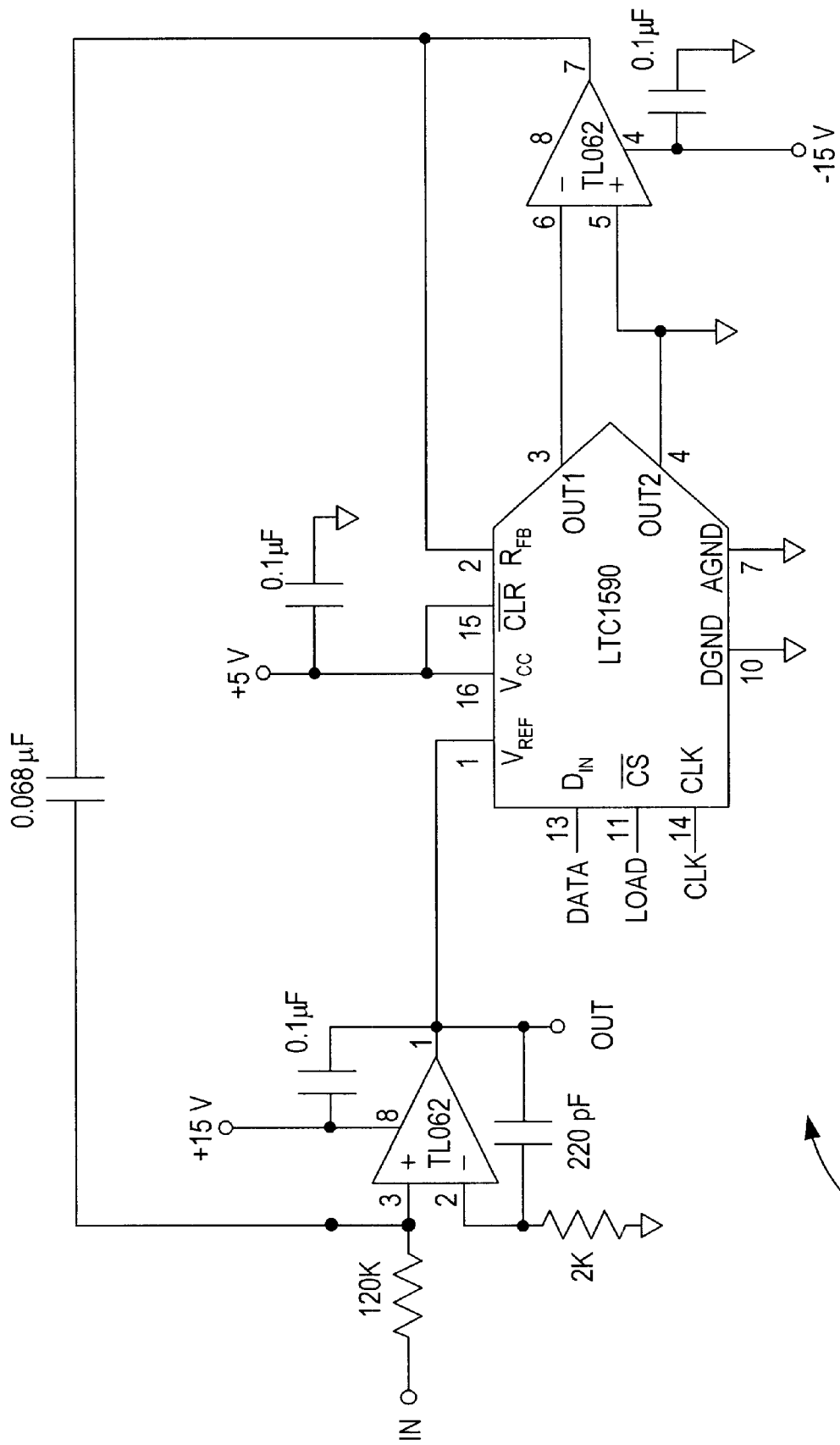
FIG. 3A shows another embodiment of an integrator circuit.

In some embodiments, additional compensation elements may be included in a variable time constant integrator 18. These compensation elements may improve stability in some embodiments. FIG. 3A shows another exemplary embodiment of a variable time constant integrator that includes two compensation elements: a 2 KΩ resistor coupled between the inverting input and ground of the first TL062 and a 220 pF capacitor coupled between the output and the inverting input of the first TL062. These compensation elements may be used since, in this particular embodiment, the signal delay through the circuit is non-ideal (i.e., greater than zero).

In the embodiment of FIG. 3A, the output (OUT) of the integrator 18 is non-inverted. However, the output of the combined LTC1590 MDAC and the second TL062 amplifier is inverted, providing negative feedback. As shown, one embodiment of an integrator 18 may include two op amps, which may both be part of a single, integrated device (as shown, a dual-amplifier such as a TL062 from Texas Instruments may be used). Similarly, an MDAC such as the LTC1590 from Linear Technology may be used in one embodiment of an integrator 18. Note that the component types and values as well as the arrangement of the components in the circuit shown in FIG. 3A are merely exemplary. Other embodiments may use other component types and values. Furthermore, other embodiments of an integrator 18 may arrange components differently and/or include fewer and/or additional components than are shown in FIG. 3A.

State Variable Filter

FIG. 4 is a circuit diagram of one embodiment of a state variable filter 10A that has a variable bandwidth. State variable filter 10A is an active filter since it includes several op amps that require a supply of electrical power during operation. State variable filter 10A includes a summing amplifier 14, a first integrator 18A, a second integrator 18B, and an inverting amplifier 15.

Summing amplifier 14 includes an op amp OA1 having a non-inverting input terminal connected to a ground reference potential. An inverting input terminal of op amp OA1 receives an input signal through a resistor R4, a low pass signal through a resistor R1, and a gain-adjusted band pass signal through a resistor R2. A resistor R3 is connected between an output terminal of op amp OA1 and the inverting input terminal to provide feedback. Summing amplifier 22 performs a mathematical summing operation upon the input signal (IN), the low pass signal (LP), and intermediate signal (IM) thereby producing a high pass signal (HP):

$$HP = -\left[\left(\frac{R3}{R4}\right) \cdot IN + \left(\frac{R3}{R1}\right) \cdot LP + \left(\frac{R3}{R2}\right) \cdot IM\right]$$

First integrator 18A includes an op amp OA3, which has a non-inverting input terminal connected to the ground reference potential. An inverting input terminal of op amp OA3 receives the high pass signal produced by summing amplifier 14 through resistor R6. A capacitor C1 is connected between an output terminal of the variable gain element 20A and the inverting input terminal. The input of variable gain element 20A is connected to the output of OA3. Integrator 18A performs a mathematical integration function upon the high pass signal (HP) thereby producing the band pass signal (BP):

$$BP = -\left(\frac{1}{G1 \cdot R6 \cdot C1}\right) \cdot \int_{-\infty}^{t} HP\,dt$$

where G1 is the gain of the variable gain element 20A. Along with C1 and R6, gain G1 of variable gain element 20A determines the time constant of integrator 18A.

A second integrator 18B includes an op amp OA4. Op amp OA4 has a non-inverting input terminal connected to the ground reference potential. An inverting input terminal of op amp OA4 receives the intermediate signal produced by integrator 18A through resistor R8. A capacitor C2 is connected between the output terminal of the variable gain element 20B and the inverting input terminal. The input of 20B is connected to the output of OA4. Integrator 18B performs a mathematical integration function upon the band pass signal (BP) thereby producing the low pass signal (LP):

$$LP = -\left(\frac{1}{G2 \cdot R8 \cdot C2}\right) \cdot \int_{-\infty}^{t} BP\,dt$$

where G2 is the gain of variable gain element 20B. Along with C2 and R8, gain G2 provided by variable gain element 20B determines the time constant of integrator 18B. The sum of the high pass and low pass signals may be provided as a notch output in some embodiments.

Inverting amplifier 15 includes an op amp OA2 having a non-inverting input terminal connected to the ground reference potential. An inverting input terminal of op amp OA2 receives the band pass signal produced by integrator 18A through a resistor R7. A resistor R5 is connected between an output terminal of op amp OA2 and the inverting input terminal. Inverting amplifier 15 amplifies or attenuates the band pass signal (BP) produced by first integrator 18A thereby producing the intermediate signal (IM):

$$IM = -\left(\frac{R7}{R5}\right) \cdot BP$$

The gain settings of variable gain elements 20A and 20B determine the corner frequencies fc of the low and high pass signals and the center frequency fo of the band pass signal. Using the component values shown in FIG. 4, the equation for fc/fo is:

$$f_c = f_o = \frac{1}{2\pi RCG}$$

where G1=G2=G, R6=R8=R, and C1=C2=C. Thus, by adjusting the gain settings of the variable gain elements, the bandwidth and corner frequencies may be varied.

In embodiments where G1=G2 (as described above), the variable gain elements 20A and 20B (collectively referred to as variable gain elements 20) may be adjusted together. For example, if the variable gain elements 20 include MDACs, they may receive the same digital input value. Similarly, if the variable gain elements 20 are controlled by a voltage, the same voltage may be used to control both gain elements. Note that in other embodiments, however, G1 may not equal G2. In such embodiments, the gain elements may be adjusted independently of each other. Furthermore, many variations on state variable filter 10A are contemplated. For example, in some embodiments, additional filter stages may be included.

Sallen and Key Filter

FIG. 5 shows one embodiment of a low-pass Sallen and Key filter 30 that includes a variable time constant integrator 18. The embodiment of variable time constant integrator 18 shown in this figure differs slightly from the embodiments shown in FIGS. 2, 3, and 4. In this embodiment, the feedback capacitor C4 is coupled between resistors R10 and R11. In contrast, in FIGS. 2–4, the feedback capacitor is coupled to the inverting input of an op amp. Additionally, in this embodiment, variable time constant integrator 18 is configured as a non-inverting integrator.

As shown in FIG. 5, an input signal IN is applied to an input terminal of the Sallen and Key filter 30. The input signal is applied to the non-inverting input terminal of op amp OA6 through resistors R10 and R11. Capacitor C5 and variable gain element 20B are coupled to the non-inverting input of op amp OA6. Variable gain element 20B has a gain G2. Variable gain element 20A and capacitor C4 are coupled to provide feedback from the output of op amp OA6 to the non-inverting input of op amp OA6. Variable gain element 20A has a gain G1. In this embodiment, the output of op amp OA6 is coupled to the inverting input. Note that in other embodiments, a feedback resistor may be coupled between the output and the inverting input.

By adjusting gains G1 and G2 of the variable gain-elements 20A and 20B, the bandwidth of the Sallen and Key filter 30 may be adjusted. In some embodiments, gains G1 and G2 may be equal.

Friends Filter

FIG. 6 shows one embodiment of a Friends or multiple feedback filter 40 that includes a variable time constant integrator 18. In this embodiment, the Friends filter 40 is configured as a low pass filter. The non-inverting input of OA7 is coupled to ground reference potential. An input signal IN is provided to the inverting input of op amp OA7 through resistors R12 and R14. A first feedback path provides feedback to the inverting input of op amp OA7 through variable gain element 20A (which has a gain of G1) and capacitor C6. A second feedback path provides feedback to the inverting input terminal of OA7 through resistors R13 and R14. A capacitor C7 and variable gain element 20B (which has a gain of G2) are coupled to between R12 and R14. Adjusting the values of G1 and G2 adjusts the time constant of variable time constant integrator 18, which in turn adjusts the bandwidth of the Friends filter 40.

PID Controller

Figure 7:
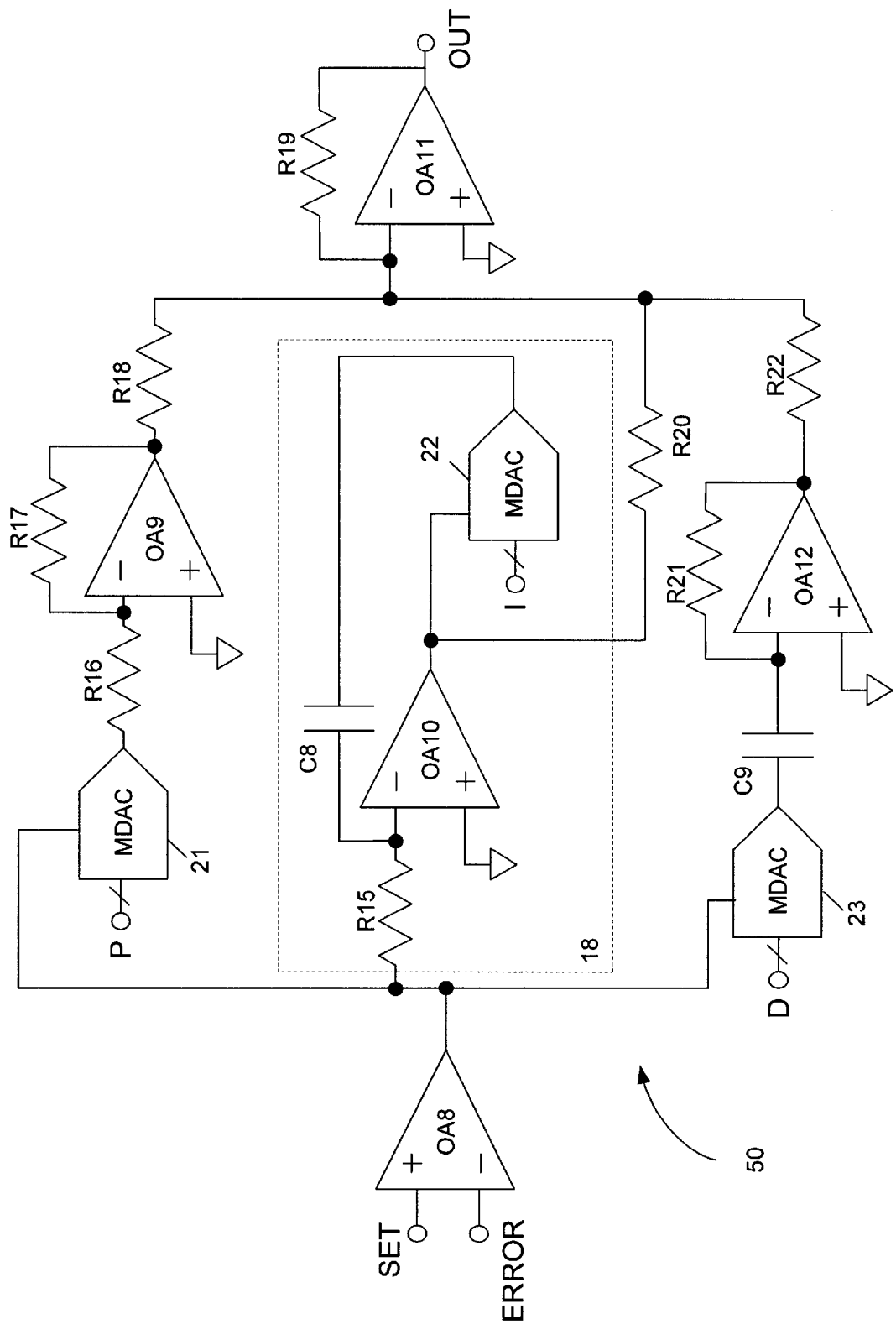
FIG. 7 is a schematic diagram of one embodiment of a PID controller.

FIG. 7 shows one embodiment of a programmable PID (Proportional, Integral, Derivative) controller 50 that includes a variable time constant integrator 18. As shown, a set signal (indicating a desired output from a system being controlled) and an error signal (indicating the difference between the actual output of the controlled system and the desired output) are provided to a comparator OA8. In one embodiment, OA8 may be an AD620 amplifier. Output signals from OA8 are provided as inputs to MDAC 21, MDAC 23, and variable time constant integrator 18.

In addition to receiving an output signal from OA8, MDAC 21 also receives a proportional gain signal, P, and outputs a signal to the inverting input of op amp OA9 through resistor R7. Op amp OA9's non-inverting input is tied to ground. Negative feedback is provided through R17. Op amp OA9 amplifies the signal from MDAC 21 and outputs an amplified signal through R18 to op amp OA11.

MDAC 23 receives the output of OA8 and a derivative gain signal, D, and outputs a signal to the inverting input of op amp OA12 through capacitor C9. Op amp OA12 receives negative feedback through R21 and outputs a signal to op amp OA11 through resistor R22.

In this embodiment, variable time constant integrator 18 includes resistor R15, op amp OA10, capacitor C8, and MDAC 22. Op amp OA10 receives an output signal from OA8 via resistor R15. An output signal from op amp OA10 and an integral gain signal, I, are input to MDAC 22. Varying the integral gain signal I adjusts the time constant of the variable time constant integrator 18. The output signal from MDAC 22 is fed back to the inverting input of OA10 through feedback capacitor C8. The output signal from OA10 is input to OA11 through resistor 20.

Output signals from OA10, OA9, and OA12 are input to the inverting input of op amp OA11. OA11 receives feedback at its inverting input through resistor R19. OA11 outputs a control signal OUT.

Figure 8:
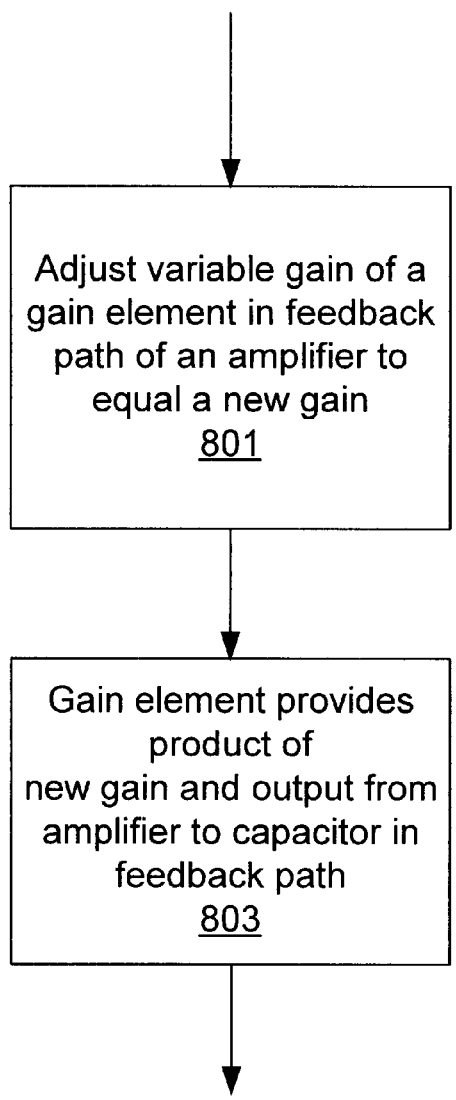
FIG. 8 is a flowchart of one embodiment of a method of adjusting the time constant of an integrator circuit.

FIG. 8 shows one embodiment of a method of adjusting the time constant of a variable time constant integrator. At 801, the gain of a variable gain element in the feedback path of an amplifier is adjusted to equal a new gain. The gain of the variable gain element may be adjusted by providing a digital value representing the desired gain to the variable gain element (e.g., if the variable gain element is an MDAC) or by adjusting a mechanical input or a voltage that controls the gain of the variable gain element. The variable gain element provides the product of the new gain and the output of the amplifier to a capacitor in the feedback path of the amplifier, as shown at 803.

Instrumentation System

Figure 9:
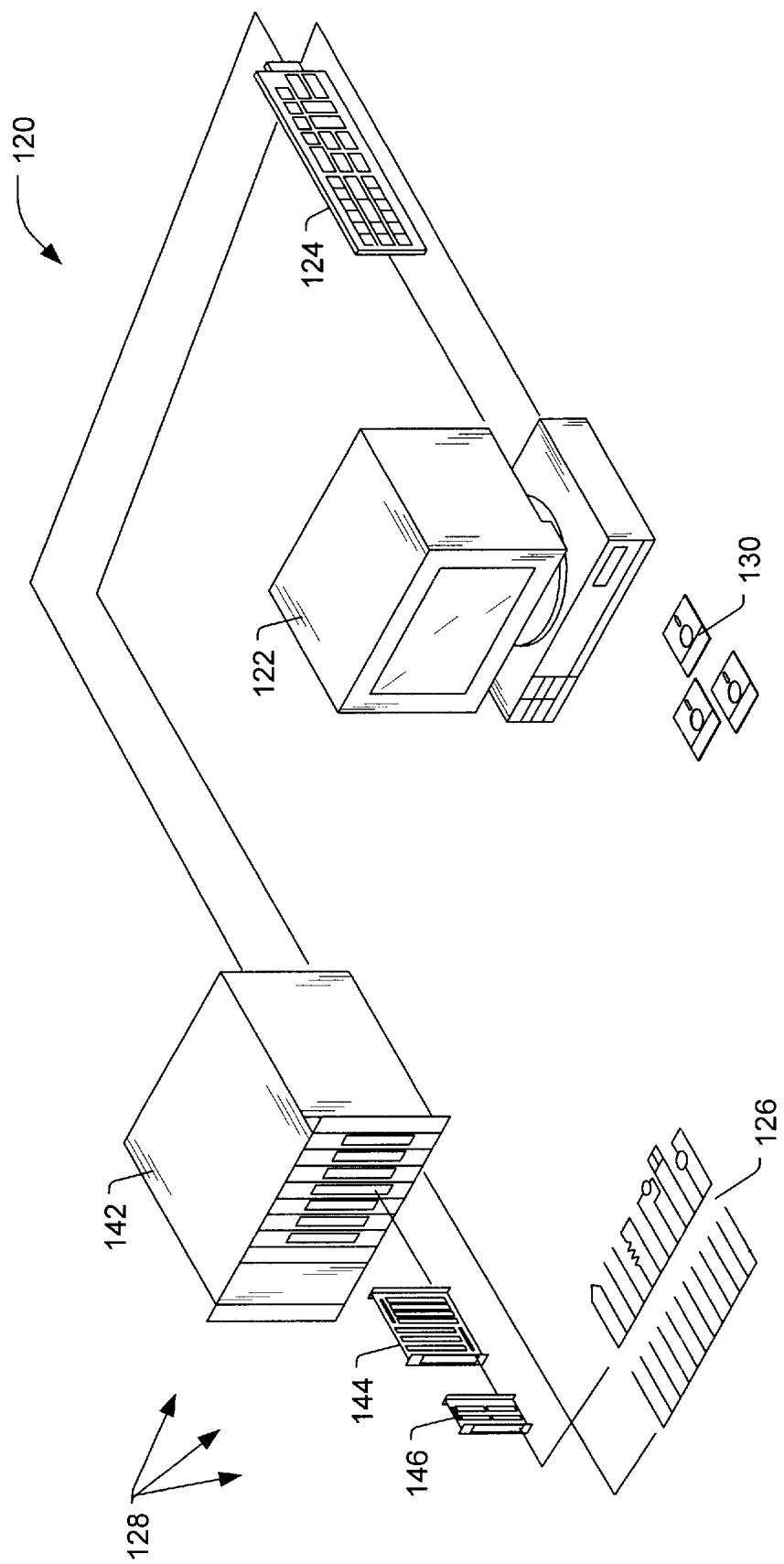
FIG. 9 illustrates one embodiment of an instrumentation system that may include an integrator circuit like the one shown in FIG. 2.

FIG. 9 is a perspective view of a computer-based instrumentation system 120 including state variable filter 10A described above. It is noted that state variable filter 10A may also be comprised in any number of various systems that use analog signal filters. Thus, FIG. 9 is illustrative only, and various other embodiments are contemplated.

Instrumentation system 120 includes a computer 122, an instrumentation device or board 124, one or more transducers 126, signal conditioning subsystem 128, and storage media 130. Possible applications of these systems include general data acquisition, including image processing/machine vision, instrumentation, industrial automation, process control, or other purposes. Signal conditioning subsystem 128 may include one or more signal conditioning modules 144 and one or more terminal blocks 146 housed within a chassis 142. Transducers 126 convert one or more physical phenomena (e.g., force, pressure, or acceleration) to electrical measurement signals. Transducers 126 may be coupled to signal conditioning subsystem 128 by wires or cables and may provide the measurement signals to signal conditioning subsystem 128 via the wires or cables.

Signal conditioning subsystem 128 conditions (e.g., amplifies, filters, or performs DC level shifting upon) measurement signals received from transducers 126. Signal conditioning subsystem 128 includes at least one state variable filter 20 described above. For example, each signal conditioning module 144 may include state variable filter 10A for filtering a measurement signal produced by one of the transducers 126. Each state variable filter 10A may receive the measurement signal and simultaneously produce low pass, high pass, and band pass signals. Signal conditioning subsystem 128 may produce conditioned measurement data using the low pass, high pass, and/or band pass signals. Signal conditioning subsystem 128 may be coupled to computer system 122 and/or an instrumentation device or board 124 by wires or cables, and signal conditioning subsystem 128 may provide the conditioned measurement data to computer system 122 via the wires or cables.

Chassis 142 may be a signal conditioning extensions for instrumentation (SCXI) chassis, signal conditioning modules 144 may be SCXI signal conditioning modules, and terminal blocks 146 may be SCXI terminal blocks. SCXI is an open architecture, multi-channel signal conditioning front-end system for instrumentation devices. SCXI includes an external chassis housing signal conditioning modules for amplifying, multiplexing, and isolating measurement signals. SCXI signal conditioning modules advantageously reduce the introduction of noise into measurement signals.

Computer 122 may comprise various standard components, including at least one central processing unit (CPU), memory, a hard drive, one or more buses, and a power supply. Computer 122 may execute operating system and other software. Computer may store conditioned measurement data received from signal conditioning subsystem 128 within the memory or upon storage media 130. Storage media 130 may include, for example, magnetic floppy disks.

Instrumentation device or card 124 may be any of various types, such as a data acquisition (DAQ) device or card, a multimeter card, a voltmeter card, etc. In FIG. 9, instrumentation device or card 124 is shown external to computer system 122 for illustrative purposes. Instrument device or board 124 may be coupled to an input/output (I/O) port of computer system 122, or adapted for insertion into an expansion slot of computer system 122. Alternately, instrumentation device or board 124 may be coupled to computer 122 by a VME extensions for instrumentation (VXI) chassis and bus or a general purpose interface bus (GPIB).

Although the system and method of the present invention has been described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims.

What is claimed is:

1. A variable time constant integrator comprising:
   an amplifier configured to generate an output signal;
   a capacitor coupled to provide feedback to the amplifier;
   a variable gain element coupled to an output of the amplifier and to the capacitor,
      wherein the variable gain element is configured to provide a product of a gain and the output signal to the capacitor;
   a resistor coupled between an inverting input of the amplifier and ground; and
   a capacitor coupled between the output of the amplifier and the inverting input of the amplifier;
   wherein the variable gain element is configured to receive an indication of a new value of the gain and to responsively set the gain equal to the new value of the gain.

2. The variable time constant integrator of claim 1, wherein the indication is a voltage level that indicates the new value of the gain.

3. The variable time constant integrator of claim 1, wherein the variable gain element includes a Multiplying Digital-to-Analog Converter (MDAC), wherein the indication is a digital value indicating a new value of the gain.

4. The variable time constant integrator of claim 1, further comprising a resistor coupled to the amplifier and to an input terminal.

5. An instrumentation system comprising:
   a transducer configured to convert one or more physical phenomena to an input signal;
   a signal conditioning subsystem coupled to receive the input signal from the transducer, wherein the signal conditioning subsystem comprises a state variable filter configured to generate a high pass signal, a low pass signal, and a band pass signal in response to the input signal;
   wherein the state variable filter comprises one or more variable time constant integrators, wherein each variable time constant integrator comprises:
      an amplifier;
      a capacitor coupled to provide feedback to the amplifier;
      a variable gain element coupled to an output of the amplifier and to the capacitor, wherein the variable gain element is configured to provide a product of a gain and an output signal from the amplifier to the capacitor, wherein the variable gain element is configured to receive an indication of a new value of the gain and to responsively set the gain equal to the new gain;
      resistor coupled between an inverting input of the amplifier and ground; and
      a capacitor coupled between the output of the amplifier and the inverting input of the amplifier.

6. The instrumentation system of claim 5, further comprising a computer coupled to the signal conditioning subsystem, wherein the signal conditioning subsystem produces measurement data, and wherein the computer system is configured to receive the measurement data from the signal conditioning subsystem and to store the measurement data.

7. A circuit, comprising:
   input circuitry configured to process an input signal; and
   a variable time constant integrator coupled to receive a processed signal from the input circuitry, wherein the variable time constant integrator comprises:
      a first amplifier and a second amplifier;
      a capacitor coupled to provide feedback from an output of the second amplifier to an input of the first amplifier;
      a MDAC (Multiplying Digital-to-Analog Converter) coupled to receive an output from the first amplifier and provide a product of a gain and the output to the second amplifier;
      wherein the MDAC is configured to vary the gain in response to a digital value.

8. The circuit of claim 7, wherein the variable time constant integrator includes:
   a resistor coupled between an inverting input of the first amplifier and ground; and
   a capacitor coupled between the output of the first amplifier and the inverting input of the first amplifier.

9. The circuit of claim 7, wherein the circuit includes a state variable filter, wherein the input circuitry includes a high-pass filter.

* * * * *

UNITED STATES PATENT AND TRADEMARK OFFICE
CERTIFICATE OF CORRECTION

PATENT NO.   : 6,608,516 B1  
DATED        : August 19, 2003  
INVENTOR(S)  : Paul A. Lennous It is certified that error appears in the above-identified patent and that said Letters Patent is hereby corrected as shown below:

Column 10,  
Line 32, please insert -- a -- before the words "resistor coupled between".

Signed and Sealed this

Sixteenth Day of December, 2003

JAMES E. ROGAN  
*Director of the United States Patent and Trademark Office*